United States Patent
Chen et al.

(10) Patent No.: US 9,465,074 B2
(45) Date of Patent: Oct. 11, 2016

(54) SYSTEM AND METHOD FOR MEASURING SWITCHING LOSS ASSOCIATED WITH SEMICONDUCTOR SWITCHING DEVICES

(71) Applicant: Ford Global Technologies, LLC, Dearborn, MI (US)

(72) Inventors: Chingchi Chen, Ann Arbor, MI (US); Krishna Prasad Bhat, Westland, MI (US); Michael W. Degner, Novi, MI (US); Ke Zou, Canton, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 263 days.

(21) Appl. No.: 14/049,448

(22) Filed: Oct. 9, 2013

(65) Prior Publication Data

US 2015/0098187 A1   Apr. 9, 2015

(51) Int. Cl.
*G01R 31/327* (2006.01)
*H01L 23/34* (2006.01)

(52) U.S. Cl.
CPC ............. *G01R 31/327* (2013.01); *H01L 23/34* (2013.01); *H01L 2924/0002* (2013.01); *H03K 2217/0045* (2013.01)

(58) Field of Classification Search
None
See application file for complete search history.

(56) References Cited

U.S. PATENT DOCUMENTS

| | | | | |
|---|---|---|---|---|
| 5,066,900 A * | 11/1991 | Bassett | ............. | H02M 3/33569 323/222 |
| 6,462,962 B1 * | 10/2002 | Cuk | ........................ | H02M 1/34 363/131 |
| 7,521,920 B2 | 4/2009 | Leibl | | |
| 8,471,535 B2 | 6/2013 | Kora et al. | | |
| 8,503,194 B2 * | 8/2013 | Moussaoui | ....... | H02M 3/33584 363/17 |
| 9,043,066 B2 * | 5/2015 | Kanzaki | .............. | B60L 11/1803 701/22 |
| 2010/0225290 A1 * | 9/2010 | Nalbant | ................ | H02M 3/156 323/282 |
| 2014/0103937 A1 * | 4/2014 | Khan | ..................... | G01R 31/40 324/509 |

FOREIGN PATENT DOCUMENTS

| | | | | |
|---|---|---|---|---|
| CN | 2101250 U | 4/1992 | | |
| EP | 1253428 | 10/2002 | | |
| EP | 1726936 | 11/2006 | | |
| EP | 2829883 A1 * | 1/2015 | ........... | G01R 31/327 |
| KR | 100753679 | 8/2007 | | |

OTHER PUBLICATIONS

Yangun Shen, et al.; "Switching Loss Analysis and Modeling of Power Semiconductor Devices Base on an Automatic Measurement System," Jul. 9, 2006; http://ieeexplore.ieee.org/xpl/login.jsp?tp=&arnumber=4078196&url=http%3A%2F%2Fieeexplore.ieee.org%2Fxpls%2Fabs_all.jsp%3Farnumber%3D4078196.

Kouro, S., et al.; "Switching Loss Analysis of Modulation Methods Used in Cascaded H-Bridge Multilevel Converters," Jun. 15, 2008; http://ieeexplore.ireee.org/xpl/login.jsp?tp+&arnumber=45927038&url=http%3A%2F%2Fieeexplore.lieee.org%2Fiel5%2F4578427%2F4591876%2F04592703.pdf%3Farnumber%3D4592703.

* cited by examiner

*Primary Examiner* — Paresh Patel
(74) *Attorney, Agent, or Firm* — Carlson, Gaskey & Olds (57) ABSTRACT

A method according to an exemplary aspect of the present disclosure includes, among other things, controlling a vehicle using switching loss information of a semiconductor switching device, the switching loss information derived from a conduction loss and a combined conduction and switching loss.

10 Claims, 7 Drawing Sheets

SYSTEM AND METHOD FOR MEASURING SWITCHING LOSS ASSOCIATED WITH SEMICONDUCTOR SWITCHING DEVICES

TECHNICAL FIELD

This disclosure relates to a semiconductor switching device, and more particularly, but not exclusively, to a system and method for measuring switching loss associated with one or more switching units of a semiconductor switching device.

BACKGROUND

Hybrid electric vehicles (HEV's), plug-in hybrid electric vehicles (PHEV's), battery electric vehicles (BEV's), fuel cell vehicles and other known electrified vehicles differ from conventional motor vehicles in that they are powered by one or more electric machines (i.e., electric motors and/or generators) instead of or in addition to an internal combustion engine. High voltage current is typically supplied to the electric machines by one or more batteries that store electrical power.

Semiconductor switching devices are known for supporting bidirectional power flow in many products. Switching units of the semiconductor device perform switching operations according to a drive signal produced by a controller to control a load. For example, electrified vehicles often include inverter systems having a plurality of semiconductor switching units, such as power MOSFET's or insulated gate bipolar transistors (IGBT's), that undergo switching operations to power one or more AC drive motors from a DC storage battery, or alternatively, to charge the DC storage battery from an AC source, such as a generator.

It may become necessary to calculate switching losses associated with the switching units of a semiconductor switching device. For example, switching loss information may be important for controlling other vehicle systems and operations.

SUMMARY

A method according to an exemplary aspect of the present disclosure includes, among other things, controlling a vehicle using switching loss information of a semiconductor switching device, the switching loss information derived from a conduction loss and a combined conduction and switching loss.

In a further non-limiting embodiment of the foregoing method, the step of controlling includes modifying an amount of thermal cooling that is communicated to cool the semiconductor switching device.

In a further non-limiting embodiment of either of the foregoing method, the method includes calculating the conduction loss and the combined conduction and switching loss by charging an inductor with energy from a capacitor, performing a multitude of switching cycles, and discharging the energy from the inductor into the capacitor.

In a further non-limiting embodiment of any of the foregoing methods, the method includes measuring voltages and currents associated with the capacitor and the inductor during each of the charging, performing and discharging steps.

In a further non-limiting embodiment of any of the foregoing methods, the method includes deriving the switching loss information by subtracting the conduction loss from the combined conduction and switching loss.

A method according to another exemplary aspect of the present disclosure includes, among other things, operating a circuit of a semiconductor switching device in a conduction cycle, calculating a conduction loss associated with the circuit, operating the circuit in a conduction and switching cycle, calculating a combined conduction and switching loss associated with the circuit, and subtracting the conduction loss from the combined conduction and switching loss to calculate a switching loss of the circuit.

In a further non-limiting embodiment of the foregoing method, operation of each of the conduction cycle and the conduction and switching cycle includes charging an inductor with energy from a capacitor, performing a plurality of switching cycles, and discharging the energy from the inductor into the capacitor.

In a further non-limiting embodiment of either of the foregoing methods, the charging step includes switching a first switching unit and a second switching unit of the circuit between ON and OFF and measuring a voltage across the capacitor before and after the switching step.

In a further non-limiting embodiment of any of the foregoing methods, the performing step includes alternately freewheeling the inductor between an upper bridge and a lower bridge of the circuit.

In a further non-limiting embodiment of any of the foregoing methods, alternately freewheeling the inductor includes alternating between switching a first switching unit ON and OFF to freewheel in the upper bridge and switching a second switching unit ON and OFF to freewheel in the lower bridge.

In a further non-limiting embodiment of any of the foregoing methods, the method includes measuring voltages and currents associated with the capacitor and the inductor during each of the charging, performing and discharging steps.

In a further non-limiting embodiment of any of the foregoing methods, the method includes deriving the switching loss based on the voltages and the currents measured during each of the charging, performing and discharging steps.

In a further non-limiting embodiment of any of the foregoing methods, the discharging step includes switching a first diode and a second diode ON.

In a further non-limiting embodiment of any of the foregoing methods, the conduction cycle includes charging an inductor with energy from a capacitor, freewheeling the inductor in either an upper bridge or a lower bridge of the circuit, and discharging the energy from the inductor into the capacitor.

In a further non-limiting embodiment of any of the foregoing methods, the conduction and switching cycle includes charging an inductor with energy from a capacitor, freewheeling the inductor alternately between an upper bridge and a lower bridge of the circuit, and discharging the energy from the inductor into the capacitor.

A semiconductor switching device, according to an exemplary aspect of the present disclosure includes, among other things, a switching loss measurement system including a first measuring device configured to measure a voltage of a first energy storage device of a semiconductor circuit, a second measuring device configured to measure a current of a second energy storage device of the semiconductor circuit, and a control unit configured to derive a switching loss associated with the semiconductor circuit based on voltage and current inputs from the first and second measuring devices.

In a further non-limiting embodiment of the foregoing device, the control unit is configured to communicate the switching loss to a control system of an electrified vehicle.

In a further non-limiting embodiment of either of the foregoing devices, the semiconductor circuit includes a plurality of switching units configured in a H-bridge arrangement.

In a further non-limiting embodiment of any of the foregoing devices, the first energy storage device is a capacitor and the second energy storage device is an inductor.

In a further non-limiting embodiment of any of the foregoing devices, the control unit is configured to operate the semiconductor circuit in each of a conduction cycle and a conduction and switching cycle in order to calculate the switching loss.

The embodiments, examples and alternatives of the preceding paragraphs, the claims, or the following description and drawings, including any of their various aspects or respective individual features, may be taken independently or in any combination. Features described in connection with one embodiment are applicable to all embodiments, unless such features are incompatible.

The various features and advantages of this disclosure will become apparent to those skilled in the art from the following detailed description. The drawings that accompany the detailed description can be briefly described as follows.

DETAILED DESCRIPTION

This disclosure relates to a system and method for measuring switching loss associated with one or more switching units of a semiconductor switching device. An H-Bridge switching topology may be operated at various predetermined switching frequencies, duty cycle ratios, and operating currents and voltages in order to measure switching loss. The circuit of the semiconductor switching device may be operated in a conduction cycle and a conduction and switching cycle in order to determine a conduction loss and a combined conduction and switching loss of the semiconductor device. The switching loss is calculated by subtracting the conduction loss from the combined conduction and switching loss. The switching loss information may be used to control a vehicle system or operation. These and other features are discussed in greater detail herein.

Figure 1:
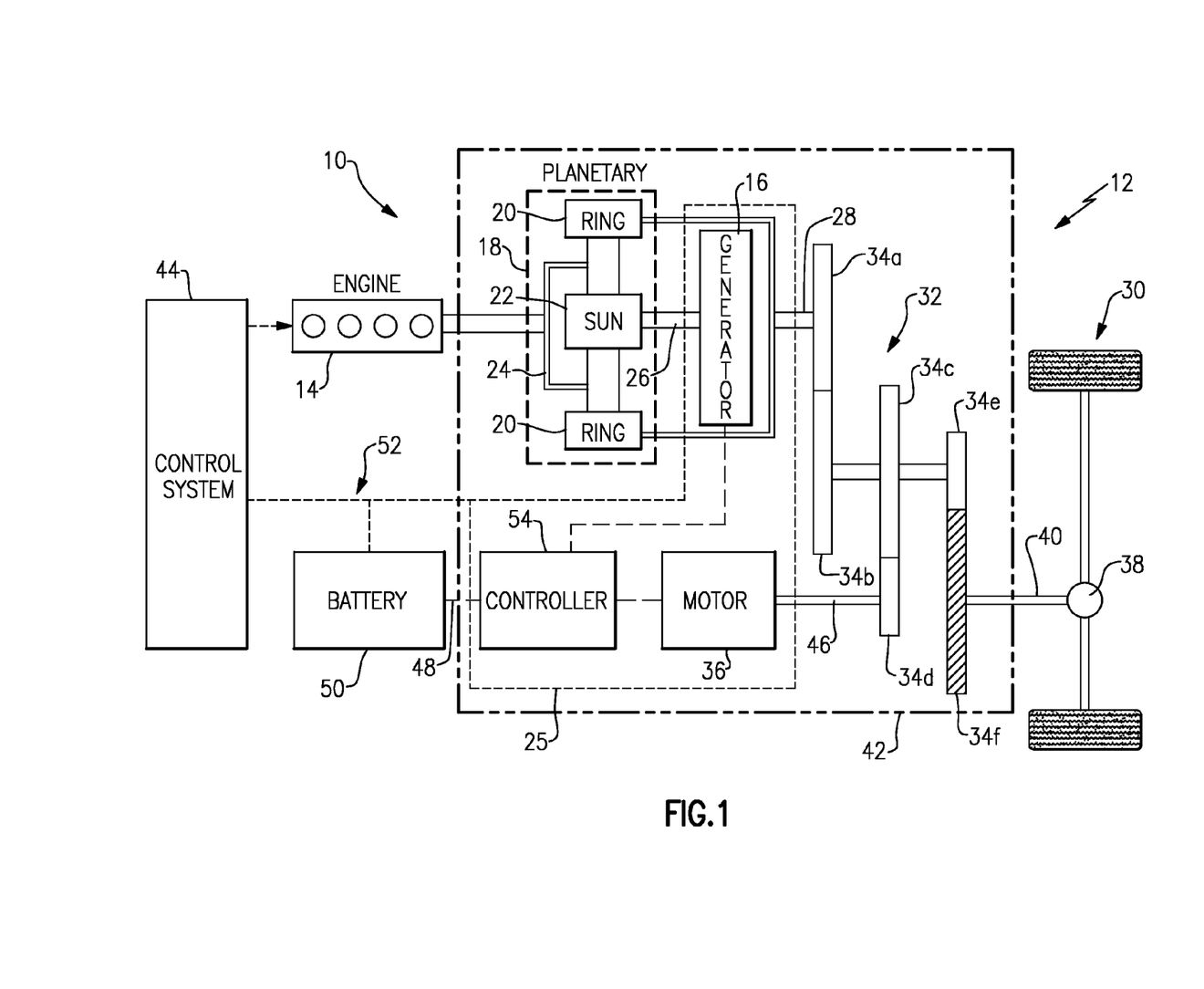
FIG. 1 schematically illustrates a powertrain of an electrified vehicle.

FIG. 1 schematically illustrates a powertrain 10 for an electrified vehicle 12, such as a HEV. Although depicted as a HEV, it should be understood that the concepts described herein are not limited to HEV's and could extend to other electrified vehicles, including but not limited to, PHEV's, BEV's, and fuel cell vehicles.

In one embodiment, the powertrain 10 is a powersplit system that employs a first drive system that includes a combination of an engine 14 and a generator 16 (i.e., a first electric machine) and a second drive system that includes at least a motor 36 (i.e., a second electric machine), the generator 16 and a battery 50. For example, the motor 36, the generator 16 and the battery 50 may make up an electric drive system 25 of the powertrain 10. The first and second drive systems generate torque to drive one or more sets of vehicle drive wheels 30 of the electrified vehicle 12, as discussed in greater detail below.

The engine 14, such as an internal combustion engine, and the generator 16 may be connected through a power transfer unit 18. In one non-limiting embodiment, the power transfer unit 18 is a planetary gear set. Of course, other types of power transfer units, including other gear sets and transmissions, may be used to connect the engine 14 to the generator 16. The power transfer unit 18 may include a ring gear 20, a sun gear 22 and a carrier assembly 24. The generator 16 is driven by the power transfer unit 18 when acting as a generator to convert kinetic energy to electrical energy. The generator 16 can alternatively function as a motor to convert electrical energy into kinetic energy, thereby outputting torque to a shaft 26 connected to the carrier assembly 24 of the power transfer unit 18. Because the generator 16 is operatively connected to the engine 14, the speed of the engine 14 can be controlled by the generator 16.

The ring gear 20 of the power transfer unit 18 may be connected to a shaft 28 that is connected to vehicle drive wheels 30 through a second power transfer unit 32. The second power transfer unit 32 may include a gear set having a plurality of gears 34A, 34B, 34C, 34D, 34E, and 34F. Other power transfer units may also be suitable. The gears 34A-34F transfer torque from the engine 14 to a differential 38 to provide traction to the vehicle drive wheels 30. The differential 38 may include a plurality of gears that enable the transfer of torque to the vehicle drive wheels 30. The second power transfer unit 32 is mechanically coupled to an axle 40 through the differential 38 to distribute torque to the vehicle drive wheels 30.

The motor 36 can also be employed to drive the vehicle drive wheels 30 by outputting torque to a shaft 46 that is also connected to the second power transfer unit 32. In one embodiment, the motor 36 and the generator 16 are part of a regenerative braking system in which both the motor 36 and the generator 16 can be employed as motors to output torque. For example, the motor 36 and the generator 16 can each output electrical power to a high voltage bus 48 and the battery 50. The battery 50 may be a high voltage battery that is capable of outputting electrical power to operate the motor 36 and the generator 16. Other types of energy storage devices and/or output devices can also be incorporated for use with the electrified vehicle 12.

The motor 36, the generator 16, the power transfer unit 18, and the power transfer unit 32 may generally be referred to as a transaxle 42, or transmission, of the electrified vehicle 12. Thus, when a driver selects a particular shift position, the transaxle 42 is appropriately controlled to provide the corresponding gear for advancing the electrified vehicle 12 by providing traction to the vehicle drive wheels 30.

The powertrain 10 may additionally include a control system 44 for monitoring and/or controlling various aspects of the electrified vehicle 12. For example, the control system 44 may communicate with the electric drive system 25, the power transfer units 18, 32 or other components to monitor and/or control the electrified vehicle 12. The control system 44 includes electronics and/or software to perform the necessary control functions for operating the electrified vehicle 12. In one embodiment, the control system 44 is a combination vehicle system controller and powertrain control module (VSC/PCM). Although it is shown as a single hardware device, the control system 44 may include multiple controllers in the form of multiple hardware devices, or multiple software controllers within one or more hardware devices.

A controller area network (CAN) 52 allows the control system 44 to communicate with the transaxle 42. For example, the control system 44 may receive signals from the transaxle 42 to indicate whether a transition between shift positions is occurring. The control system 44 may also communicate with a battery control module of the battery 50, or other control devices.

Additionally, the electric drive system 25 may include one or more controllers 54, such as an inverter system controller (ISC). The controller 54 is configured to control specific components within the transaxle 42, such as the generator 16 and/or the motor 36, such as for supporting bidirectional power flow. In one embodiment, the controller 54 is an inverter system controller combined with a variable voltage converter (ISC/VVC).

Figure 2:
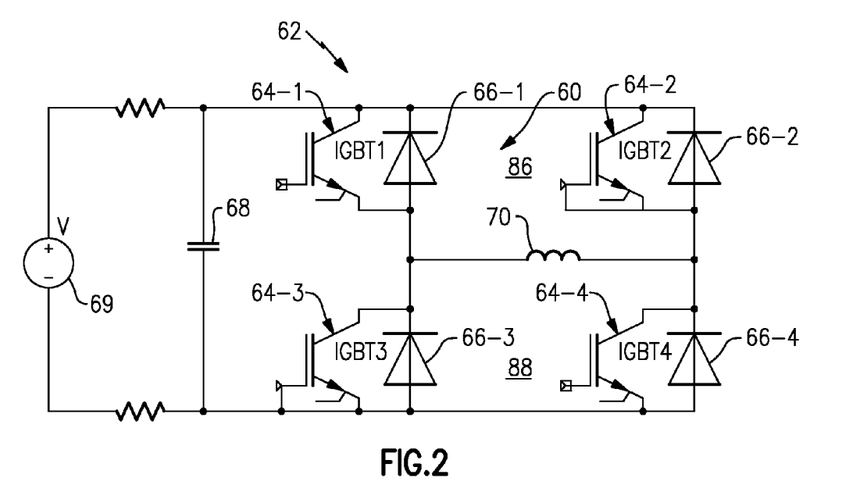
FIG. 2 illustrates a topology of a semiconductor switching device circuit.

FIG. 2 illustrates a circuit 60 of a semiconductor switching device 62. In one embodiment, the semiconductor switching device 62 is part of an inverter system for an electrified vehicle, such as the electrified vehicle 12 of FIG. 1. For example, the semiconductor switching device 62 may undergo switching operations to power the motor 36 using energy from the battery 50, or alternatively, to charge the battery 50 via the generator 16. It should be appreciated that the exemplary semiconductor switching device 62 could alternatively be used as part of a battery charging system, a switched mode power supply, an industrial drive, a home appliance, or any other appliance that utilizes semiconductor switching devices.

The semiconductor switching device 62 includes a plurality of switching units 64 and diodes 66. In one non-limiting embodiment, the switching units 64 and diodes 66 are arranged as IGBT/diode pairs. However, other configurations are also contemplated.

The circuit 60 may be configured in an H-bridge arrangement that includes an upper bridge 86 and a lower bridge 88. Each of the upper bridge 86 and the lower bridge 88 may include two pairs of switching units 64 and diodes 66. In one non-limiting embodiment, the upper bridge 88 includes a first switching unit 64-1 (also labeled IGBT1), a first diode 66-1, a second switching unit 64-2 (also labeled IGBT2) and a second diode 66-2, and the lower bridge 88 includes a third switching unit 64-3 (also labeled IGBT3), a third diode 66-3, a fourth switching unit 64-4 (also labeled IGBT4) and a fourth diode 66-4. The first switching unit 64-1 and the fourth switching unit 64-4 are configured as active switches, whereas the diodes 66-2 and 66-3 are configured as passive switches, in one embodiment.

The semiconductor switching device 62 may additionally incorporate a capacitor 68 (i.e., a first energy storage device) and an inductor 70 (i.e., a second energy storage device). In one embodiment, the capacitor 68 is a near ideal capacitor or a fixed film capacitor that has a predetermined amount of energy and voltage in its initial (steady) stage. A voltage source 69 supplies the energy to the capacitor 68. In one non-limiting embodiment, the voltage source 69 is the high voltage battery of an electrified vehicle (see, for example, battery 50 of FIG. 1).

As discussed in greater detail below, an exemplary method of measuring switching loss may include operating the circuit 60 by transferring the energy from the capacitor 68 to the inductor 70, performing a series of switching cycles (switching state), and returning the energy to the capacitor 68. The difference in voltage ($\Delta V$) across the capacitor 68 between the initial and final states can provide a numerical value of energy loss in terms of a combined switching, conduction and stray loss. A corresponding test can be performed to duplicate the current profile in the inductor 70, which can be used in conjunction with the combined switching, conduction and stray loss to determine a total switching loss associated with the semiconductor switching device 62.

Figure 3:
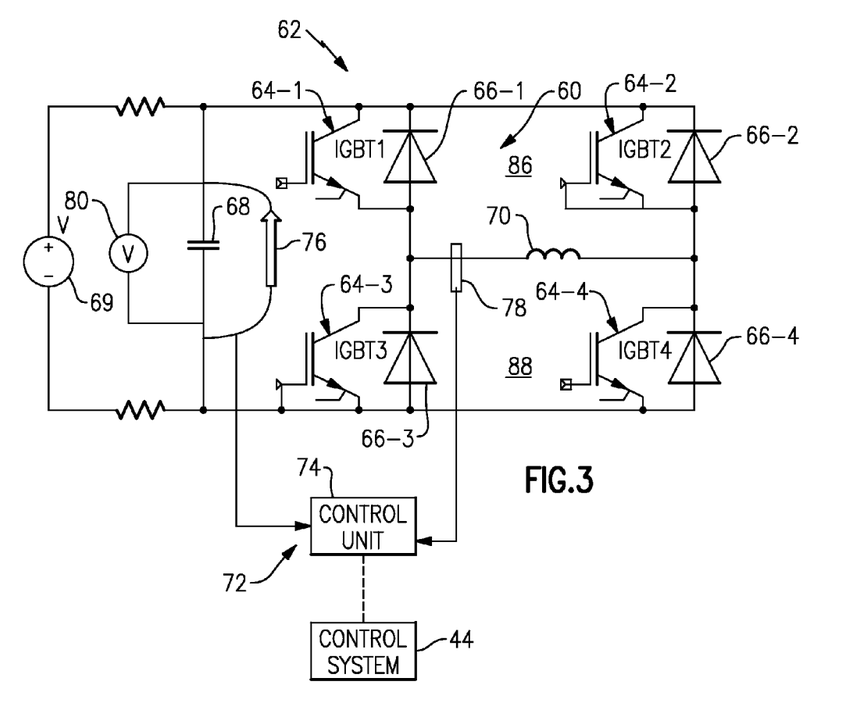
FIG. 3 schematically illustrates a switching loss measurement system for measuring switching losses associated with one or more switching units of a semiconductor switching device.

Referring to FIG. 3, a switching loss measurement system 72 may be connected to the circuit 60 for measuring switching losses associated with one or more switching units 64 of the semiconductor switching device 62. The switching loss measurement system 72 may include a control unit 74, a first measurement device 76 and a second measurement device 78 that are in communication with the control unit 74, and optionally, a volt meter 80. In one embodiment, the first measurement device 76 is a passive probe or sensor and the second measurement device 78 is a current probe or sensor, such as a hall type probe or sensor.

In use, the first measurement device 76 measures a voltage across the capacitor 68. The volt member 80 may be a digital volt meter for displaying the voltage measured by the first measurement device 76. The second measurement device 78 measures current through the inductor 70. The voltage and current readings of the first measurement device 76 and the second measurement device 78 may be stored, evaluated and/or processed by the control unit 74. In one embodiment, the control unit 74 is an oscilloscope that can display the voltage and current information measured by the switching loss measurement system 72 in graphical form, such as by plotting voltage/current over time.

In another embodiment, the switching loss measurement system 72 may be an integrated component of the semiconductor switching device 62. The control unit 74 is programmed with the necessary logic (including any necessary algorithms, etc.) for recording and analyzing the voltage and current readings from the switching loss measurement system 72 to derive a switching loss associated with the switching units 64 of the semiconductor switching device 62. In one embodiment, the switching loss measurement system 72 is part of an inverter system that communicates switching loss information to the control system 44 of the electrified vehicle 12. The control system 44 may then use the switching loss information to control various aspects of the vehicle.

In one embodiment, the control unit 74 can operate the circuit 60 of the semiconductor switching device 62 in both a conduction cycle and a conduction and switching cycle in order to measure a switching loss associated with the semiconductor switching device 62. In one embodiment, the conduction cycle and the conduction and switching cycle each include three phases. Phase 1 involves charging the inductor 70 with energy from the energy storage device 68. Phase 2 involves performing a plurality of switching cycles in one or both of the upper bridge 86 (Phase 2A) or a lower bridge 88 (phase 2B) of the circuit 60. Phase 3 involves discharging the energy from the inductor 70 back into the capacitor 68. Each of these phases is discussed in greater detail below with reference to FIGS. 4-7.

Figure 4A:
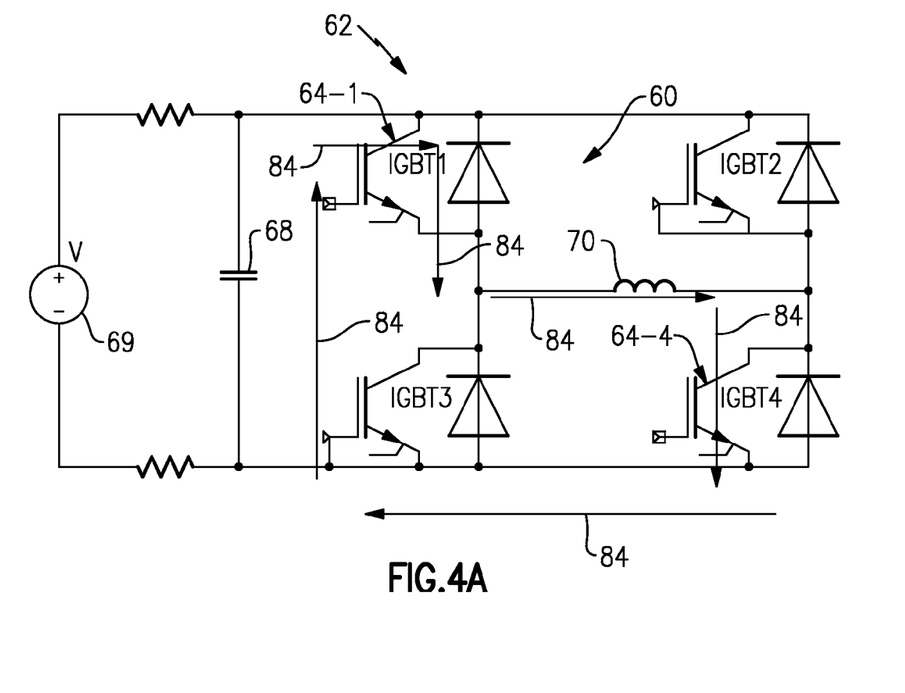
FIG. 4A illustrates a first phase of an operating cycle of a circuit of a semiconductor switching device.
Figure 4B:
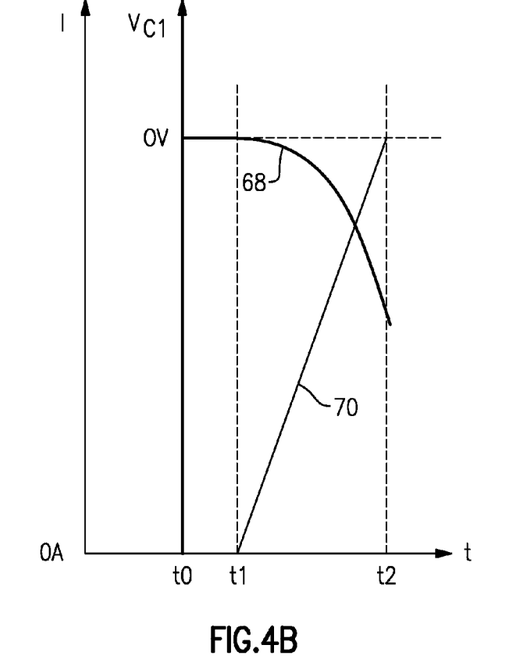
FIG. 4B is a graphical representation of current and voltage profiles of energy storage devices of a semiconductor switching device during the first phase of a circuit operating cycle.

FIGS. 4A and 4B illustrate Phase 1 of operation of the circuit 60. In this phase, the capacitor 68 charges the inductor 70. At time (t)=0, the voltage $V_{c1}$ of the first capacitor 68 will be equal to the voltage V supplied by the voltage source 69. Energy is communicated along a current path 84 (shown schematically with arrows in FIG. 4A) during a time period between time t1 and time t2 (see FIG. 4B) in order to charge the inductor 70. Between time t1 and t2, the switching unit 64-1 and the switching unit 64-4 are switched "ON" in order to charge the inductor 70. The voltage $V_{c1}$ of the capacitor 68 at any given time (t) may be measured and analyzed by the switching loss measurement system 72 (see FIG. 3) and can be expressed by the following equation:

$$V_{C1}(t) = L_1 dI(t)/dt + I(t)*(R_{IGBT1} + R_{IGBT4} + R_{L1}) \quad (1)$$

where
C1=the capacitor 68
L1=the inductor 70
IGBT1=the first switching unit 64-1
IGBT4=the fourth switching unit 64-4

Figure 5A:
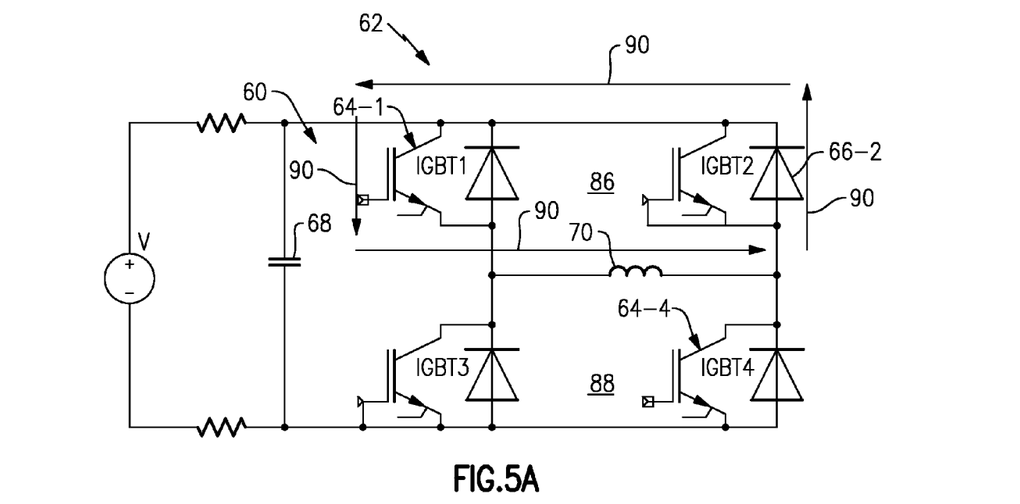
FIG. 5A illustrates a first portion of a second phase of an operating cycle of a circuit.
Figure 5B:
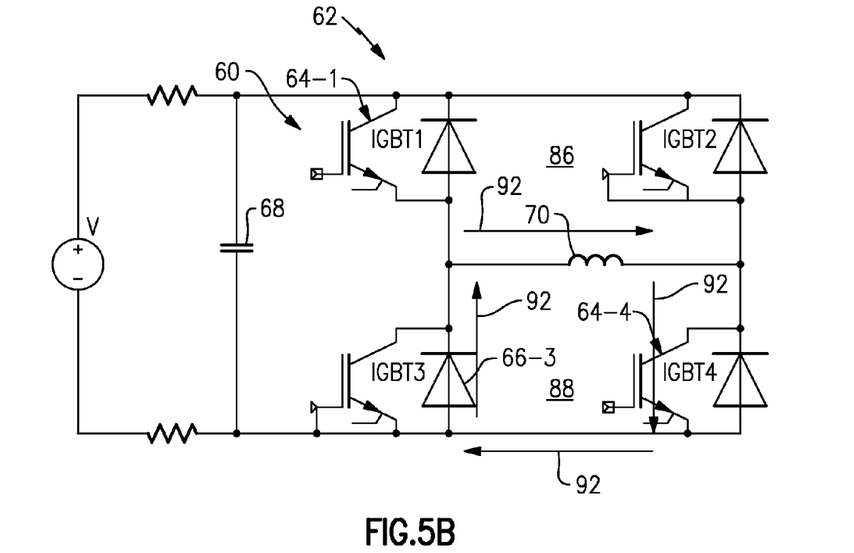
FIG. 5B illustrates a second portion of a second phase of an operating cycle of a circuit.
Figure 5C:
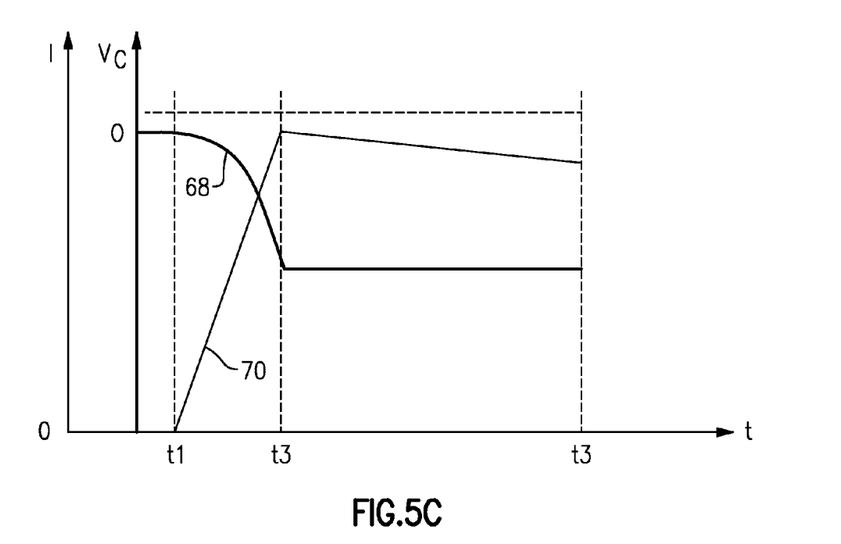
FIG. 5C is a graphical representation of current and voltage profiles of energy storage devices of a semiconductor switching device during the second phase of a circuit operating cycle.

Next, as illustrated in FIGS. 5A, 5B and 5C, a plurality of switching cycles may be performed in either or both of the upper bridge 86 (Phase 2A) and the lower bridge 88 (Phase 2B) of the circuit 60. In other words, the inductor 70 may freewheel in one or both of the upper bridge 86 and the lower bridge 88 between a time t2 and a time t3 (see FIG. 5C) by running current along a current path 90 (see FIG. 5A) and/or a current path 92 (see FIG. 5B). In one embodiment, a plurality of switching cycles are performed alternately between the upper bridge 86 and the lower bridge 88 for a specific number of cycles between time t2 and time t3. The number of cycles may vary depending upon design specific parameters. The duration between time t2 and time t3 is dependent upon various factors such as switching speed, switching frequency and inductor characteristics. Either the capacitor 68 or the inductor 70 may supply the necessary energy for performing the switching cycles.

Referring to FIG. 5A, the switching unit 64-1 and the diode 66-2 are switched "ON" in order to allow the inductor 70 to freewheel in the upper bridge 86. Referring to FIG. 5B, the switching unit 64-4 and the diode 66-3 are switched "ON" in order to allow the inductor 70 to freewheel in the lower bridge 88 between time t2 and time t3. In other words, during Phases 2A and 2B, the switching units 64-1 and 64-4 may be alternately turned ON and OFF to induce a switching action and hence change the freewheeling loop of the inductor 70 current. Each time the switching units 64-1 and 64-4 are switched between ON and OFF, the energy for the switching losses (turn-on, reverse recovery and turn-off losses) can be measured at the capacitor 68 and the inductor 70 via the switching loss measurement system 72. These measurements are communicated to the control unit 74 for further processing.

The current I of the inductor 70 at any given time t during Phase 2A or 2B may be measured and calculated by the control unit 74 of the switching loss measurement system 72 and can be expressed by the following equation:

$$I(t) = I(t_2) * e^{-(t)/\tau} \quad (2)$$

where
$\tau = L1/(R_{L1} + R_{D2} + R_{IGBT1})$

Figure 6A:
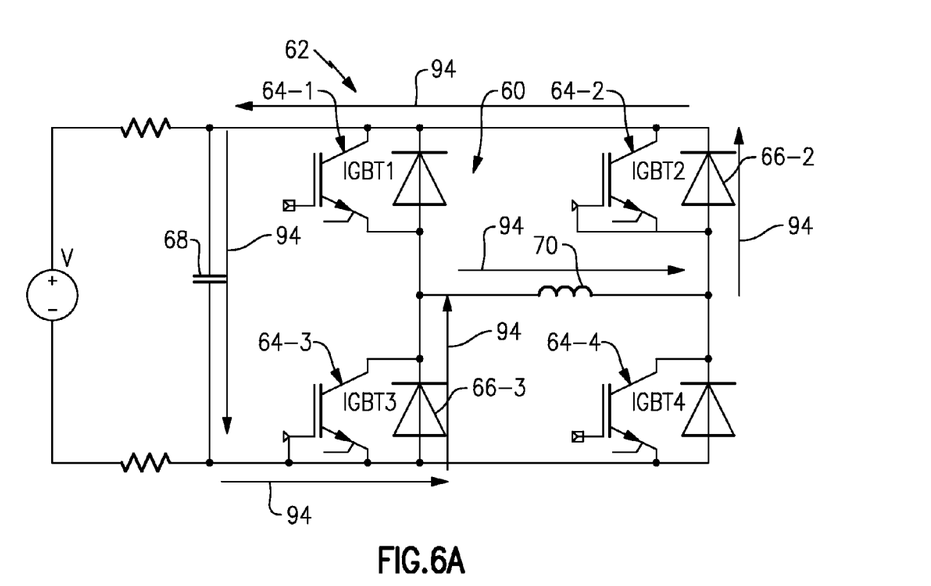
FIG. 6A illustrates a third phase of an operating cycle of a circuit.
Figure 6B:
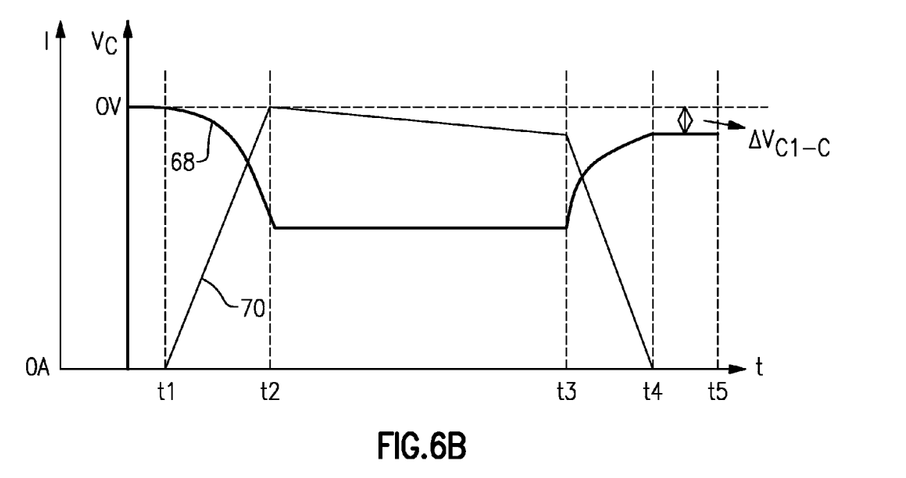
FIG. 6B is a graphical representation of current and voltage profiles of energy storage devices of a semiconductor switching device during the third phase of a circuit operating cycle.

Phase 3 of the circuit 60 operation is illustrated in FIGS. 6A and 6B and occurs between time t3 and time t4. During this phase, the inductor 70 discharges its energy to the capacitor 68. In one embodiment, energy is transferred along a current path 94 back to the capacitor 68. The inductor 70 charges the capacitor 68 via the diodes 66-2 and 66-3, which are turned ON during Phase 3. Each switching unit 64 is turned OFF during Phase 3.

For a given time t between time t3 and time t4, the voltage V of the capacitor 68 can be expressed by the following equation:

$$V(t) = L * dI(t)/dt \quad (3)$$

Accordingly, a difference $\Delta V_{c1-c}$ between the voltage at time=0 and time=t4 can be expressed by the following equation:

$$\Delta Vc_{1-C} = Vc_1(t_0) - Vc_1(t_4) \quad (4)$$

In one non-limiting embodiment, the conduction cycle of the circuit 60 is a compilation of Phase 1, either Phase 2A or Phase 2B, and Phase 3. Operation in the conduction cycle enables the extraction of a conduction loss $E_C$ associated with the semiconductor switching device 62. The conduction loss $E_C$ can be represented by the following equation:

$$E_c = 0.5 * C_1 * [(V_{C1(t0)}^2 - V_{C1-C(t4)}^2)] \quad (5)$$

In another non-limiting embodiment, the conduction and switching cycle consists of Phase 1, Phase 2A, Phase 2B and Phase 3. The alternating repetition of Phases 2A and 2B determines the switching cycle count of the circuit 60. Each switching cycle count will involve a turn-on loss, a reverse recovery loss, and a turn-off loss for two switching units 64 (i.e., switching units 64-1 and 64-4).

Figure 7:
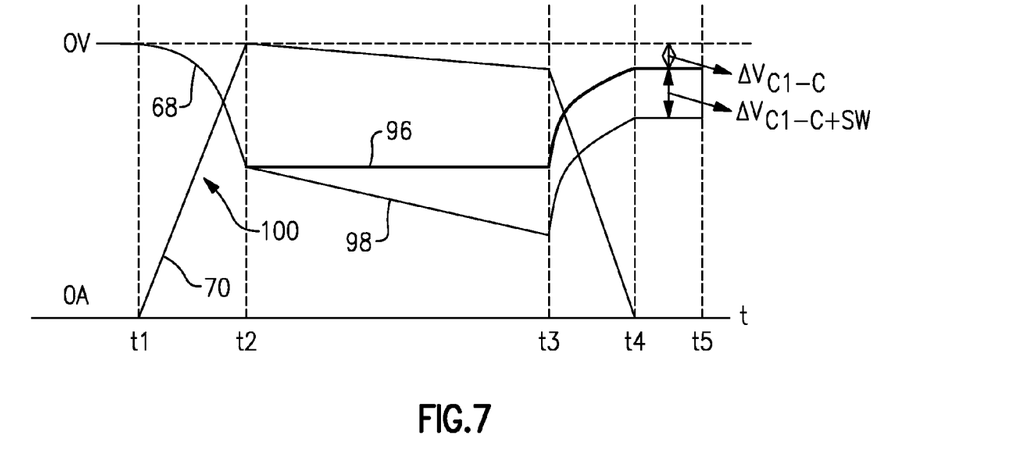
FIG. 7 is a graphical representation of a conduction cycle and a conduction and switching cycle of a semiconductor switching device circuit.

Referring to FIG. 7, the conduction cycle and the conduction and switching cycle are represented in graphical form. Curve 96 indicates the conduction cycle, and curve 98 indicates the conduction and switching cycle. It may be assumed that the current profile 100 of the inductor 70 is replicated in both the conduction cycle 96 and the conduction and switching cycle 98. From time t2 to t3, there is a drop in capacitor 68 voltage, indicating that the capacitor 68 is providing the necessary energy for the switching processes that occur during phases 2A and 2B. Therefore, the conduction and switching loss energy can be calculated as:

$$E_{C+SW} = 0.5 * C_1 * [(V_{C1(t0)}^2 - V_{C1-C+SW(t4)}^2)] \quad (6)$$

Hence, the total switching loss energy can be calculated by subtracting the conduction loss from the combined conduction and switching loss as shown by the following equation:

$$E_{SW} = (E_{C+SW}) - (E_C) \quad (7)$$

Assuming that the switching loss is equal between two switching units 64, the switching loss per cycle per switching unit 64 can be calculated as:

$$E=E_{SW}/2N \qquad (8)$$

In one embodiment, the control unit 74 of the switching loss measurement system 72 is programmed with each of equations (1) through (8) and any other necessary hardware and software for calculating switching loss information in the manner described above. The switching loss information calculated using the system and method of this disclosure can be used to control various operations of an electrified vehicle. For example, in on one non-limiting embodiment, the switching loss information can be used to modify an amount of thermal cooling that is communicated to cool the semiconductor switching device 62, among other control operations.

Although the different non-limiting embodiments are illustrated as having specific components or steps, the embodiments of this disclosure are not limited to those particular combinations. It is possible to use some of the components or features from any of the non-limiting embodiments in combination with features or components from any of the other non-limiting embodiments.

It should be understood that like reference numerals identify corresponding or similar elements throughout the several drawings. It should be understood that although a particular component arrangement is disclosed and illustrated in these exemplary embodiments, other arrangements could also benefit from the teachings of this disclosure.

The foregoing description shall be interpreted as illustrative and not in any limiting sense. A worker of ordinary skill in the art would understand that certain modifications could come within the scope of this disclosure. For these reasons, the following claims should be studied to determine the true scope and content of this disclosure.

What is claimed is:

1. A method, comprising:
   operating a circuit of a semiconductor switching device in a conduction cycle;
   calculating a conduction loss associated with the circuit;
   operating the circuit in a conduction and switching cycle;
   calculating a combined conduction and switching loss associated with the circuit; and
   subtracting the conduction loss from the combined conduction and switching loss to calculate a switching loss of the circuit.

2. The method as recited in claim 1, wherein operation of each of the conduction cycle and the conduction and switching cycle includes:
   charging an inductor with energy from a capacitor;
   performing a plurality of switching cycles; and
   discharging the energy from the inductor into the capacitor.

3. The method as recited in claim 2, wherein the charging step includes:
   switching a first switching unit and a second switching unit of the circuit between ON and OFF; and
   measuring a voltage across the capacitor before and after the switching step.

4. The method as recited in claim 2, wherein the performing step includes alternately freewheeling the inductor between an upper bridge and a lower bridge of the circuit.

5. The method as recited in claim 4, wherein the step of alternately freewheeling the inductor includes:
   alternating between switching a first switching unit ON and OFF to freewheel in the upper bridge and switching a second switching unit ON and OFF to freewheel in the lower bridge.

6. The method as recited in claim 2, comprising measuring voltages and currents associated with the capacitor and the inductor during each of the charging, performing and discharging steps.

7. The method as recited in claim 6, comprising deriving the switching loss based on the voltages and the currents measured during each of the charging, performing and discharging steps.

8. The method as recited in claim 2, wherein the discharging step includes switching a first diode and a second diode ON.

9. The method as recited in claim 1, wherein the conduction cycle includes:
   charging an inductor with energy from a capacitor;
   freewheeling the inductor in either an upper bridge or a lower bridge of the circuit; and
   discharging the energy from the inductor into the capacitor.

10. The method as recited in claim 1, wherein the conduction and switching cycle includes:
    charging an inductor with energy from a capacitor;
    freewheeling the inductor alternately between an upper bridge and a lower bridge of the circuit; and
    discharging the energy from the inductor into the capacitor.

* * * * *